United States Patent
Hung et al.

(10) Patent No.: US 9,575,607 B2
(45) Date of Patent: Feb. 21, 2017

(54) ELECTRODE OF SELF-CAPACITIVE TOUCH PANEL UTILIZING SERPENTINE TRACE TO INCREASE RESISTANCE

(71) Applicant: MStar Semiconductor, Inc., Hsinchu Hsien (TW)

(72) Inventors: Guo-Kiang Hung, New Taipei (TW); Chien-Chuan Chen, Hsinchu County (TW); Chao-Yang Kuo, Hsinchu County (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 133 days.

(21) Appl. No.: 14/622,357

(22) Filed: Feb. 13, 2015

(65) Prior Publication Data

US 2015/0234497 A1    Aug. 20, 2015

(30) Foreign Application Priority Data

Feb. 14, 2014 (TW) .............................. 103104837 A
Mar. 12, 2014 (TW) .............................. 103108588 A (51) Int. Cl.
*G06F 3/044* (2006.01)
*H05K 1/11* (2006.01)
*H05K 1/16* (2006.01)

(52) U.S. Cl.
CPC ................. *G06F 3/044* (2013.01); *H05K 1/11* (2013.01); *H05K 1/167* (2013.01); *H05K 2201/097* (2013.01); *H05K 2201/09263* (2013.01); *H05K 2201/09272* (2013.01); *H05K 2201/09281* (2013.01); *H05K 2201/09381* (2013.01); *H05K 2201/09418* (2013.01); *H05K 2201/10053* (2013.01)

(58) Field of Classification Search
CPC .......... G06F 3/044; G06F 3/045; G06F 21/32; G06K 9/0002
See application file for complete search history.

(56) References Cited

U.S. PATENT DOCUMENTS

| | | | |
|---|---|---|---|
| 2007/0257894 A1* | 11/2007 | Philipp | G06F 3/044 345/173 |
| 2010/0289765 A1* | 11/2010 | Noguchi | G02F 1/13338 345/173 |
| 2012/0092350 A1* | 4/2012 | Ganapathi | G02B 26/0833 345/501 |

FOREIGN PATENT DOCUMENTS

| | | |
|---|---|---|
| TW | M451595 | 4/2013 |
| TW | 201333799 | 8/2013 |

OTHER PUBLICATIONS

Taiwan Intellectual Property Office (TIPO), Office Action issued Mar. 17, 2016.

* cited by examiner

*Primary Examiner* — Shaheda Abdin
(74) *Attorney, Agent, or Firm* — WPAT, PC; Justin King; Douglas A. Hosack (57) ABSTRACT

An electrode of a self-capacitive touch panel is provided. The electrode, coupled to a control circuit of the self-capacitive touch panel via a conducting wire, includes: a serpentine portion, having a first side; a main portion, having a second side; and a connecting portion, connected to the first side and the second side to connect the serpentine portion and the main portion. A length of the connecting portion is smaller than a length of the first side and a length of the second side.

16 Claims, 10 Drawing Sheets

ELECTRODE OF SELF-CAPACITIVE TOUCH PANEL UTILIZING SERPENTINE TRACE TO INCREASE RESISTANCE

This application claims the benefits of Taiwan application Serial No. 103104837, filed Feb. 14, 2014 and application Serial No. 103108588, filed Mar. 12, 2014, the subject matters of which are incorporated herein by reference.

BACKGROUND OF THE INVENTION

Field of the Invention

The invention relates in general to an electrode of a self-capacitive touch panel, and more particularly, to an electrode of a self-capacitive touch panel that utilizes a serpentine trace to increase resistance.

Description of the Related Art

Figure 1:
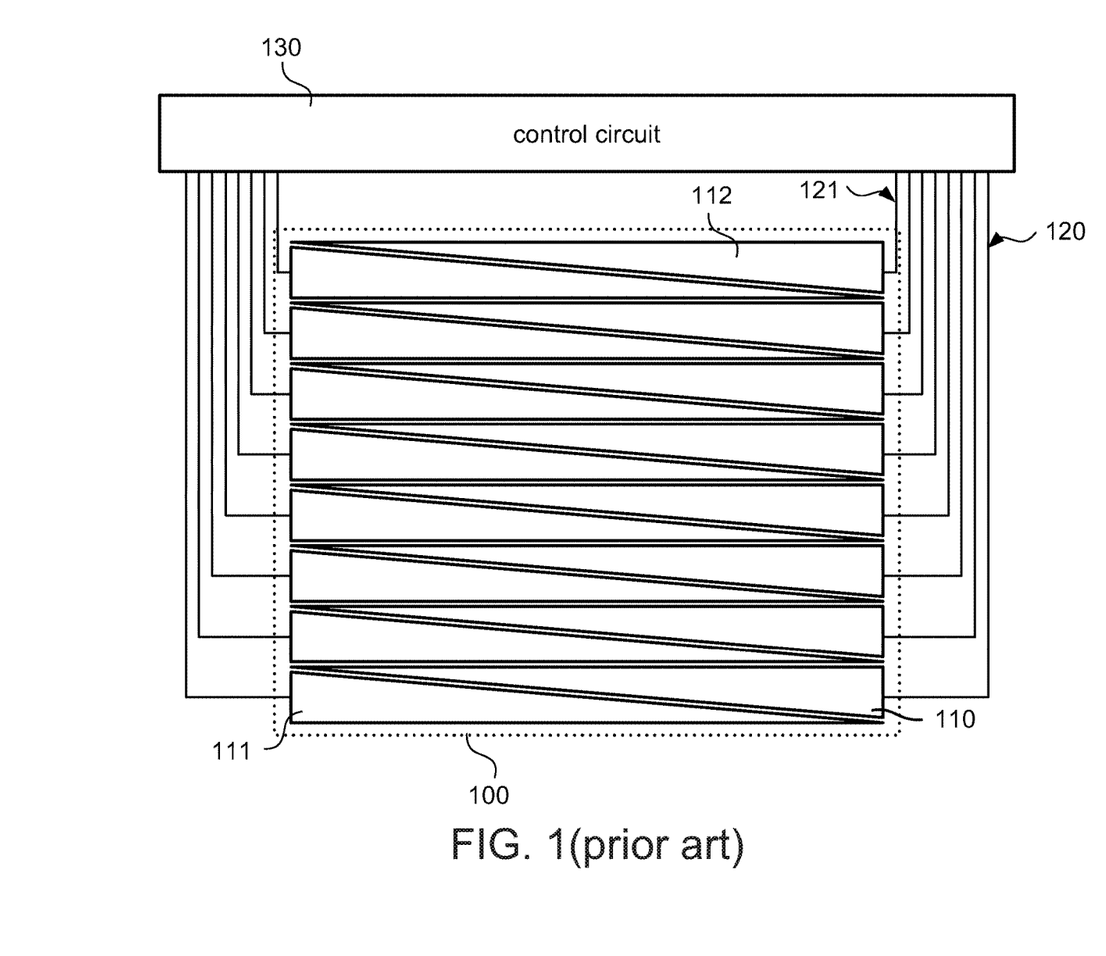
FIG. 1 is a configuration of electrodes and a control circuit of a conventional self-capacitive touch panel.

FIG. 1 shows a configuration of electrodes and a control circuit of a conventional self-capacitive touch panel. A sensing region 100 includes a plurality of electrodes, i.e., at least an electrode 110, an electrode 111 and an electrode 112. The electrodes 110 and 111 are paired electrodes. Each of the electrodes is connected to the control circuit 130 via a conducting wire. For example, the electrode 110 is connected to the control circuit 130 via a conducting wire 120, and the electrode 112 is connected to the control circuit 130 via a conducting wire 121. According to changes in sensing capacitance values of the electrodes, the control circuit 130 determines information such as position and duration of touch control events. Due to different distances from the electrodes to the control circuit 130, lengths of the conducting wires influence resistance values of the electrodes corresponding to the control circuit. Known to one person skilled in the art, the resistance of the conducting wire is proportional to the length of the conducting wire. For the conventional circuit configuration of the electrodes and the control circuit in FIG. 1, as an electrode is located farther away from the control circuit 130, the corresponding resistance value gets larger. The unequal resistance values of the electrodes not only result in circuit design complications but also have an influence on the determination accuracy of the control circuit 130. Given a solution that is capable of individually adjusting the resistance values of the electrodes, circuit design flexibilities can be enhanced to improve the accuracy performance of self-capacitive touch panels.

SUMMARY OF THE INVENTION

The invention is directed to an electrode of a self-capacitive touch panel that utilizes a serpentine trace to increase resistance, so as to enhance circuit design flexibilities and touch control accuracy.

The present invention discloses an electrode of a self-capacitive touch panel. The electrode, connected to a control circuit via a conducting wire of the self-capacitive touch panel, includes a main portion and a serpentine portion connected to the main portion. A serpentine trace of the serpentine portion increases resistance of the electrode corresponding to the control circuit.

The present invention further discloses an electrode of a self-capacitive touch panel. The electrode, connected to a control circuit of the self-capacitive touch panel via a conducting wire, includes: a serpentine portion, having a first side; a main portion, having a second side; and a connecting portion, connected to the first side and the second side to connect the serpentine portion and the main portion. A length of the connecting portion is smaller than a length of the first side and a length of the second side.

In the present invention, the electrode of a self-capacitive touch panel increases the resistance value of the electrode corresponding to the control circuit through a flexible design. Compared to a conventional electrode, the present invention is capable of designing the length of a serpentine trace according to a distance between the electrode and the control circuit to counterbalance errors caused by different lengths of the conducting wires. Further, by further changing the resistance, a cut-off frequency of a low-pass filter (LPF) is adjusted to filter out surges that affect the touch control accuracy.

The above and other aspects of the invention will become better understood with regard to the following detailed description of the preferred but non-limiting embodiments. The following description is made with reference to the accompanying drawings.

DETAILED DESCRIPTION OF THE INVENTION

Technical terms of the application are based on the general definition in the technical field of the application. If the application describes or explains one or some terms, definitions of the terms are based on the description or explanation of the application.

The present invention discloses an electrode of a self-capacitive touch panel. The electrode increases resistance value by a serpentine trace, and is capable of flexibly adjusting the resistance of individual electrodes corresponding to a control circuit. In possible implementation, one skilled person in the art may choose equivalent electrode patterns to implement the disclosure based on the disclosure of the application. That is, the implementation of the disclosure is not limited in the embodiments disclosed in the disclosure. Further, materials and manufacturing methods of the electrode of a self-capacitive touch panel that increase resistance by a serpentine trace of the disclosure may be known. Without affecting the full disclosure and possible implementation of the device of the electrode design pattern, the known details are omitted.

Figure 2A:
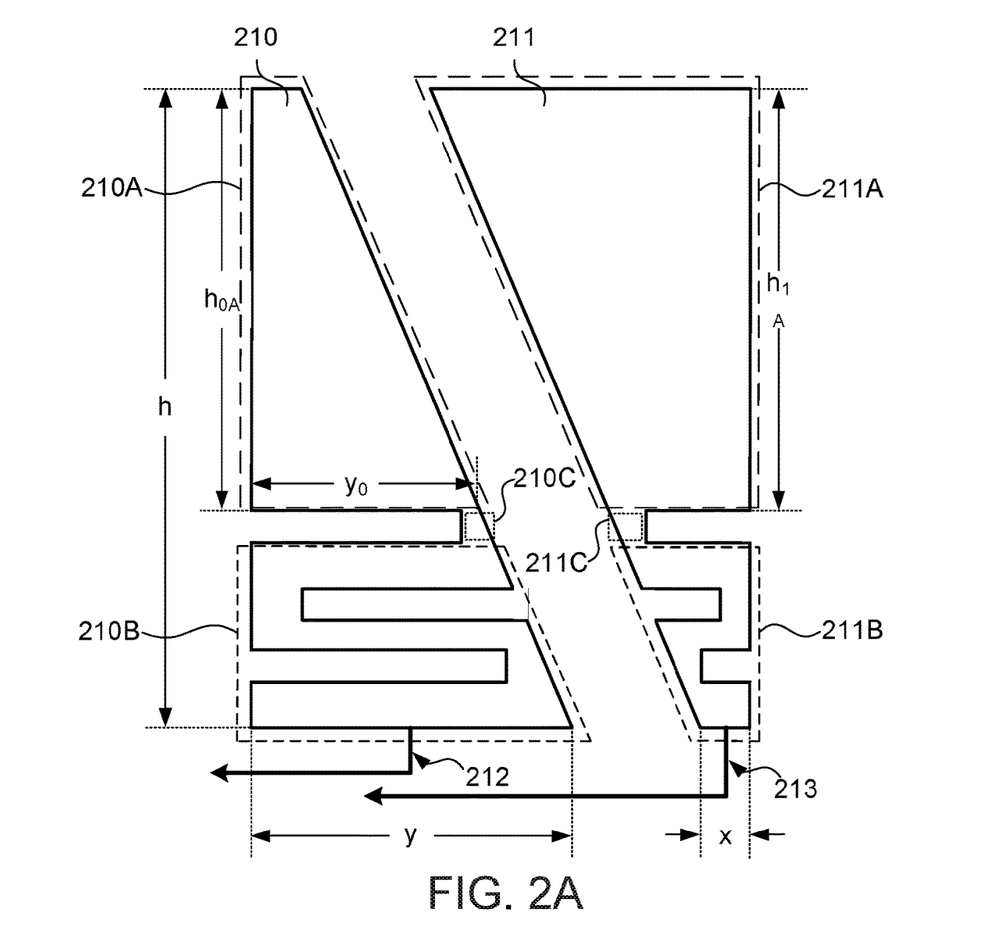
FIG. 2A is a schematic diagram of electrodes of a self-capacitive touch panel that increase equivalent capacitance according to an embodiment of the present invention.

FIG. 2A shows a schematic diagram of electrodes of a self-capacitive touch panel for increasing resistance according to an embodiment of the present invention. In the diagram, similar to the paired electrodes 110 and 111 in FIG. 1, electrodes 210 and 211 are paired electrodes. The electrode 210 includes a part that is not manufactured as a curved section (or referred to as a serpentine trace). This part is referred to as a main portion 210A below. The electrode 210 further includes a serpentine portion 210B appearing as a serpentine trace. The electrode 211 includes a main portion 211A and a serpentine portion 211B. The serpentine portion 210B is connected to a control circuit (not shown) of the touch panel via a conducting wire 212, and the serpentine portion 211B is connected to the control circuit of the touch panel via a conducting wire 213. The paired electrodes 210 and 211 are compared with the paired electrodes 110 and 111 below to explain how the serpentine portion of the present invention increases surface resistance of the electrodes.

Figure 3:
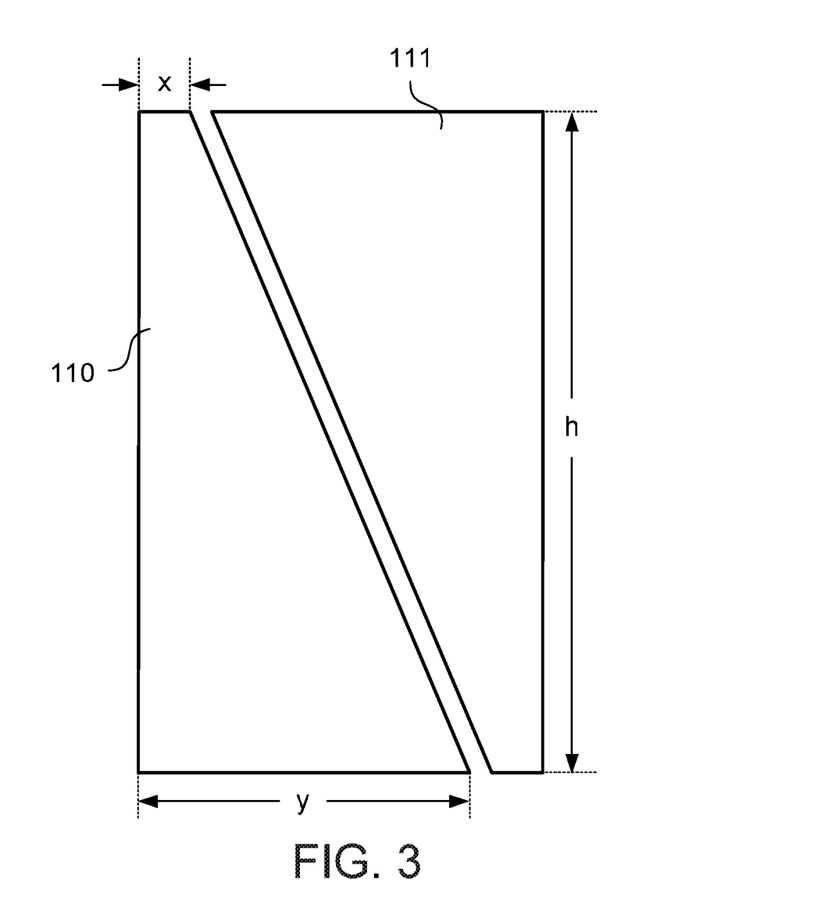
FIG. 3 is an enlarged view of the paired electrodes 110 and 111 in FIG. 1.

The pair electrodes 110 and 111 are substantially equal in area, and usually have planar contours as or similar to triangles. For example, the triangles are right triangles or other types of triangles, and an acute angle of the planar contours similar to triangles are replaced by an extremely short side. FIG. 3 shows an enlarged view of the paired electrodes 110 and 111 in FIG. 1. Referring to FIG. 3, the short side has a length x. When heights of the electrodes 110 and 111 are far greater than the short side x, the planar contours of the electrodes 110 and 111 appear more similar to triangles. Surface resistance of the electrodes 110 and 111 may be obtained through the calculation below:

$$R_s = \frac{h \times \ln\left(\frac{y}{x}\right)}{y - x} \times R_\square$$

In the above, $R_\square$ is a resistivity of a material of the electrodes. In a preferred embodiment, h=51 mm, x=0.3 mm, and y=1.23 mm. With the above calculation, the surface resistance of the electrode 110 or the electrode 111 is approximately 77.37 $R_\square$. The surface resistance of the electrode 210 and the electrode 211 in FIG. 2A is calculated in two parts. That is, the surface resistance of the main portion 210A (211A) and the surface resistance of the serpentine portion 210B (211B) are individually calculated, and are added to each other to obtain the total surface resistance of the electrode 210 (211). Taking the electrode 210 for example, the surface resistance of the main portion 210A is $$R_{210A} = \frac{h_{0A} \times \ln\left(\frac{y_0}{x}\right)}{y_0 - x} \times R_\square.$$

Figure 2B:
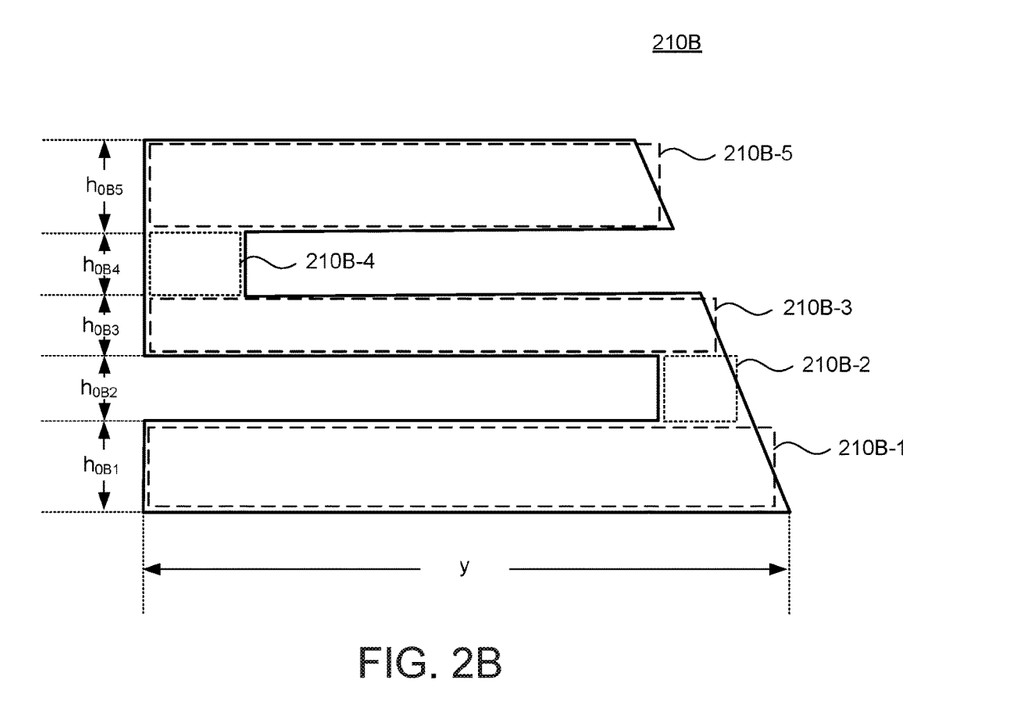
FIG. 2B is a schematic diagram of a method for dividing the sub-traces of the serpentine portion 210B according to an embodiment of the present invention.

Refer to FIG. 2B for the calculation of the surface resistance of the serpentine portion 210B. The serpentine portion 210B is divided into five sub-traces, which are respectively sub-traces 210B-1 to 210B-5. A width of the sub-trace 210B-1 is $h_{OB1}$, and a line width between the sub-trace 210B-1 and the sub-trace 210B-3 is $h_{OB2}$ (i.e., the width of the sub-trace 210B-2), and so forth. Further, lengths of the sub-traces are respectively $y_1$ to $y_5$. The sub-traces are as shown by areas that are similar to rectangles. The surface resistance of the rectangle is calculated as:

$$R_s = \frac{y}{h} \times R_\square$$

Therefore, the surface resistance of the serpentine portions 210B is $(y_1/h_{OB1}+y_2/h_{OB2}+y_3/h_{OB3}+y_4/h_{OB4}+y_5/h_{OB5}) R_\square$.

Figure 2C:
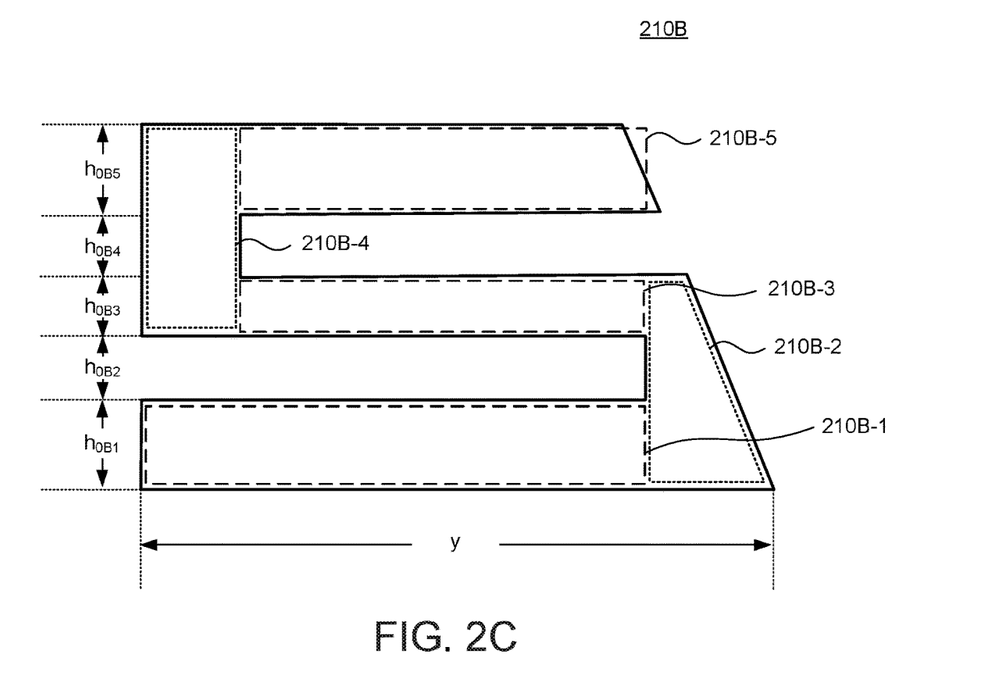
FIG. 2C is a schematic diagram of a method for dividing the sub-traces of the serpentine portion 210B according to another embodiment of the present invention.

In a preferred embodiment, the sub-trace 210B-1, the sub-trace 210B-3 and the sub-trace 210B-5 are parallel, and have the same line widths and gaps. That is, $h_{OB1}=h_{OB2}=h_{OB3}=h_{OB4}=h_{OB5}=h'$. When the height $h_{OA}$ of the main portion 210A in FIG. 2A is 49.0 mm and the width $y_0$ is 1.2025 mm, the surface resistance of the main portion 210A is about $R_{210A}=75.38 R_\square$, and the surface resistance of the serpentine portion 210B is $R_{210B}=(1.23/0.3+1+1.210/0.3+1+1.208/0.3) R_\square$ (assuming that the line width and the gap are equal to h'=0.3 mm, and the sub-trace 210B-2 and the sub-trace 210B-4 are similar to squares), which is about 14.19 $R_\square$. Therefore, the total surface resistance of the electrode 210 is about 75.38 $R_\square$+14.19 $R_\square$=89.57 $R_\square$, which is greater than the surface resistance of the electrode 110 shown in FIG. 3. It should be noted that, in FIG. 2A, a connecting portion 210C that connects the main portion 210A and the serpentine portion 210B and a connecting portion 210C that connects the main portion 211A and the serpentine portion 211B are further included. By including the surface resistance of the connecting portion 210C (assuming the connection portion 210C is a square), the surface resistance of the electrode 210 is about 90.57 $R_\square$. In different embodiments, the connecting portion 210C (211C) may be a part of the main portion 210A (211A) or the serpentine portion 210B (211B). Further, instead of dividing the serpentine portion 210B by the exemplary method in FIG. 2A, the serpentine portion 210B may be divided as the method in FIG. 2C, in which the individual surface resistance of the sub-traces is different from the surface resistance of the sub-traces in FIG. 2B, with however the total surface resistance being the same.

Figure 8:
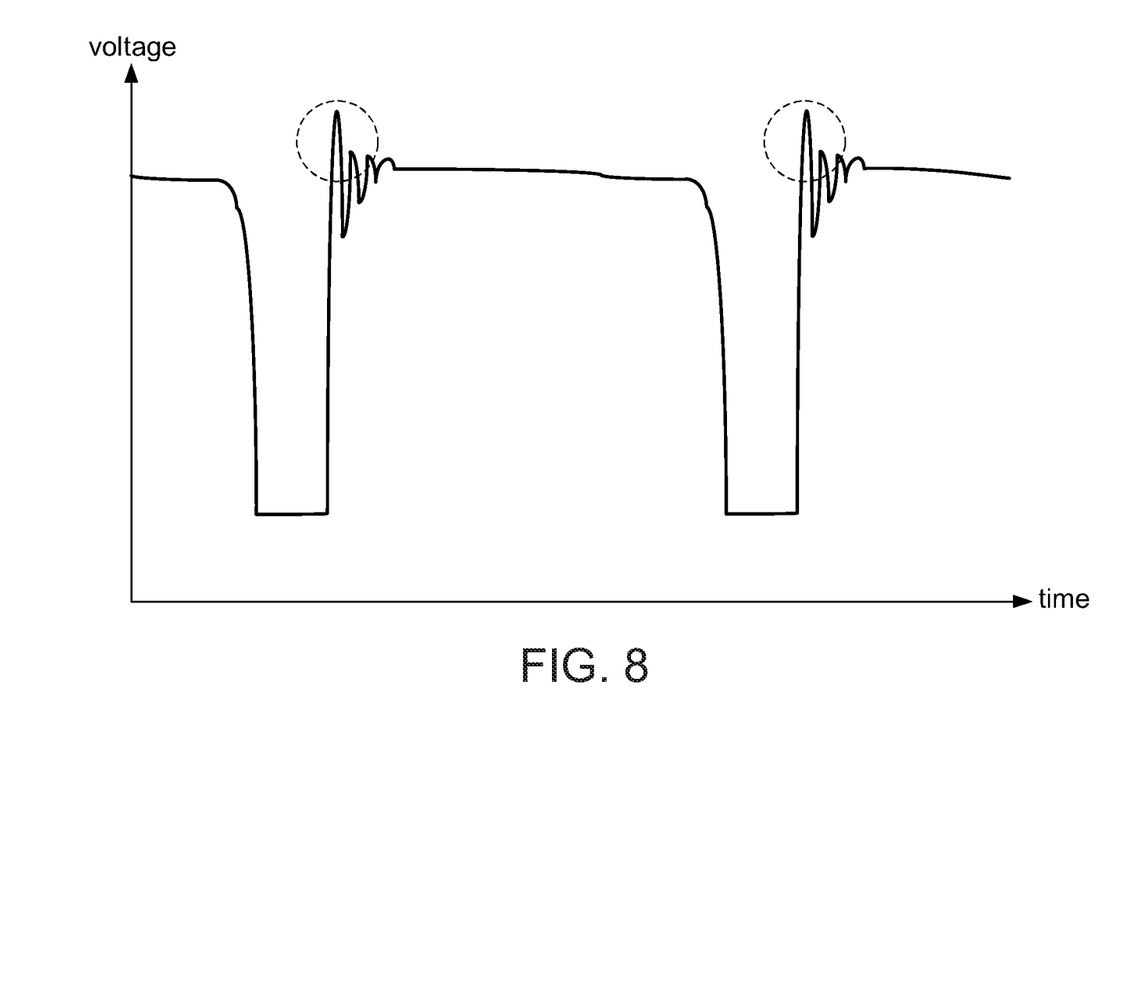
FIG. 8 is a schematic diagram of a charging/discharging period of a conventional self-capacitive touch panel.

It is known from the above description that, a part of the electrode may be manufactured as a serpentine trace to increase the surface resistance of the electrode, and the surface resistance may be changed by adjusting the number of sub-traces of the serpentine trace. As the number of sub-traces divided from the serpentine trace in a same area gets larger, the surface resistance of the electrode also gets larger. This is due to a low-pass filter (LPF) formed by the surface resistance of the electrode and a capacitor in the self-capacitive touch panel. More specifically, two electrodes of a capacitor in the touch panel are respectively formed by an electrode and a substrate of the touch panel. The substrate is generally grounded. Thus, a cut-off frequency of a corresponding LPF may be set to a desired frequency band by adjusting the surface resistance of individual electrodes. For example, when the control circuit 130 in FIG. 1 charges the capacitor of the self-capacitive touch panel, a surge is likely to occur to result in an unstable circuit. FIG. 8 shows a schematic diagram of a charging/discharging period of a conventional self-capacitive touch panel. As shown, dotted regions indicate surges occurring during a charging process, and these surges are high-frequency signals, and may be filtered out by the above LPF. Given the same capacitor, the resistance of the electrodes corresponding to the control circuit may be adjusted, such that the cut-off frequency of the LPF corresponding to the electrodes is within a frequency range of the surges to effectively eliminate the surges.

According to a preferred embodiment of the present invention, when the electrode 210 includes the serpentine portion 210B and the adjacent and paired electrode 211 also includes the serpentine portion 211B, by manufacturing the serpentine traces to the paired electrodes, the accuracy for determining the touch control position can be enhanced. In a preferred embodiment, the paired electrodes include serpentine portions that have the same heights. Taking FIG. 2A for example, i.e., when $(h-h_{0A})=(h-h_{1A})$, it means that the main portions of the paired electrodes also have the same heights, i.e., $h_{0A}=h_{1A}$. In another preferred embodiment, the serpentine portion 211B includes a plurality of sub-traces, which have the same line widths as the sub-traces of the serpentine portion 210B, and the same gaps as the gaps between the serpentine trace 210B. In another preferred embodiment, the plurality of sub-traces of the serpentine portion 211B have the same line widths and the same gaps, which are respectively the same as the line widths and the gaps between the serpentine portion 210B.

Figure 4:
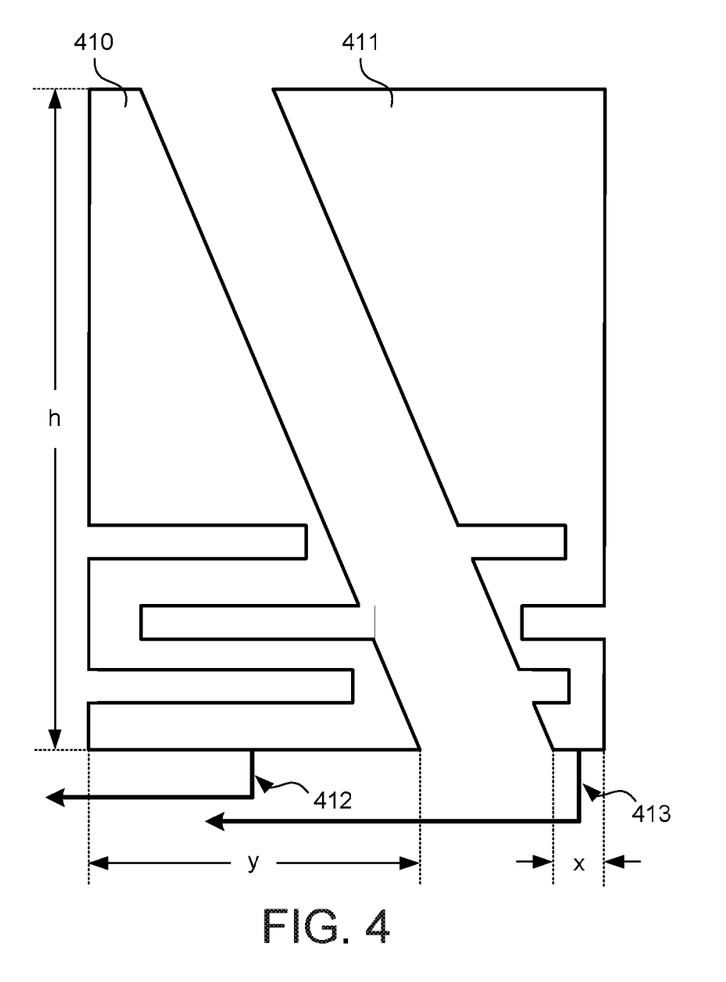
FIG. 4 is a schematic diagram of an electrode of a self-capacitive touch panel that increases equivalent capacitance according to an embodiment of the present invention.

FIG. 4 shows a schematic diagram of electrodes of a self-capacitive touch panel that increase resistance according to an embodiment of the present invention. A difference of the embodiment from the embodiment in FIG. 2A is that, serpentine traces of electrodes 410 and 411 are bent toward the same direction, instead of the opposite directions as in FIG. 2. The electrode 410 is connected to a control circuit (not shown) of the touch panel via a conducting wire 412, and the electrode 411 is connected to the control circuit of the touch panel via a conducting wire 413.

Figure 5:
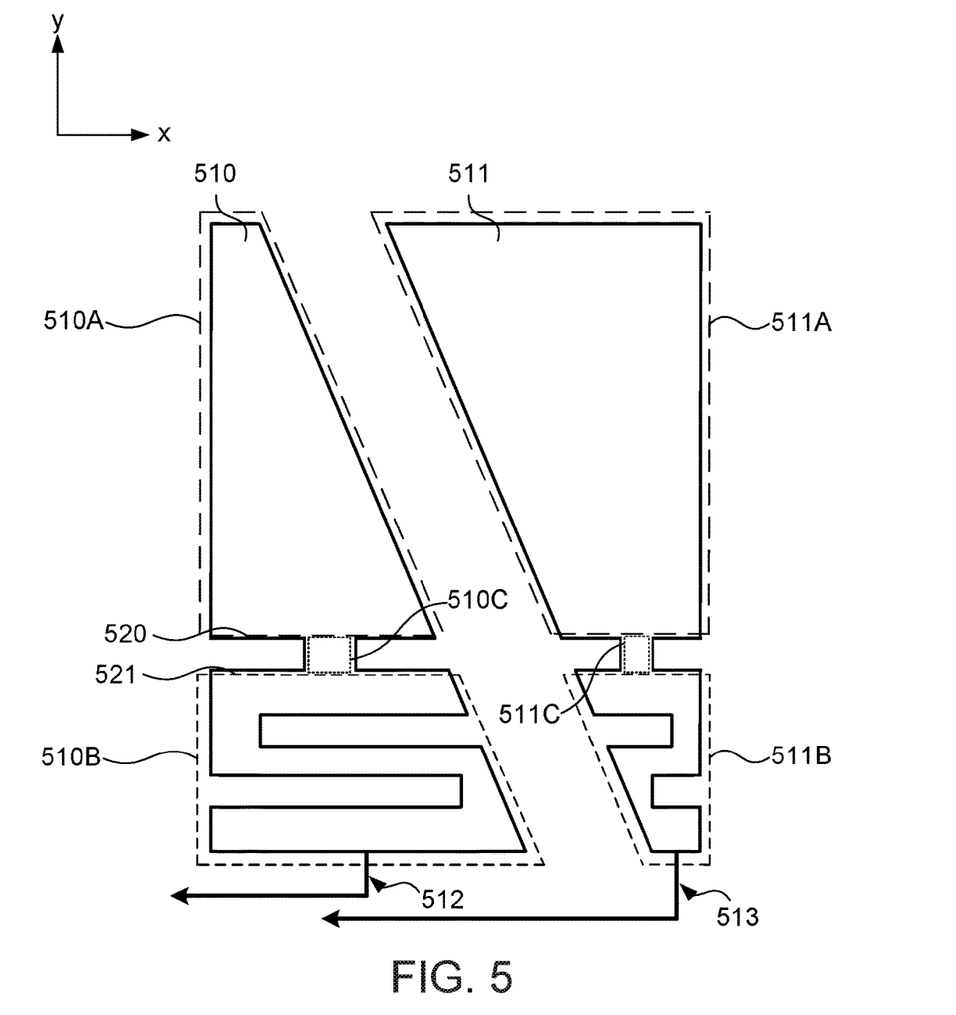
FIG. 5 is a schematic diagram of an electrode of a self-capacitive touch panel that increases equivalent capacitance according to another embodiment of the present invention.

FIG. 5 shows a schematic diagram of electrodes of a self-capacitive touch panel that increase resistance according to an embodiment of the present invention. An electrode 510 includes a main portion 510A, a serpentine portion 510B and a connecting portion 510C. The electrode 511 includes a main portion 511A, a serpentine portion 511B and a connecting portion 511C. The serpentine portion 510B is connected to a control circuit (not shown) of the touch panel via a conducting wire 512. The serpentine portion 511B is connected to the control circuit of the touch panel via a conducting wire 513. The main portion 510A has a quadrilateral planar contour, and includes an edge (i.e., a lower side of four sides of the main portion 510A), and the serpentine portion 510B similarly has a quadrilateral planar contour and includes an edge 521 (i.e., an upper side of four sides of the serpentine portion 510B). The connecting portion 510C connects the edge 520 and the edge 521 to connect the main portion 510A and the serpentine portion 510B. In a preferred embodiment, the edge 520 and the edge 521 are parallel; a length of the connecting portion 520C is smaller than lengths of the edge 520 and the edge 521, i.e., the length of the connecting portion 510C along the x-direction is smaller than the lengths of the edge 520 and the edge 521 along the x-direction. Similarly, although the connecting portions 210C and 211C in FIG. 2A have different sizes and positions from those of the connecting portions 510C and 511C in FIG. 5, these connecting portions have the same characteristics. That is, the connecting portion 210C connects the main portion 210a and the serpentine portion 210B, and the width of the connecting portion 210C is smaller than the lower side of the main portion 210B (the side connected to the connecting portion 210C) and the upper side of the serpentine portion 210B (the side connected to the connecting portion 210C). In a preferred embodiment, the lower side of the main portion 210A and the upper side of the serpentine portion 210B are parallel. The electrode 211 has the same characteristics, and such details are omitted.

Figure 6:
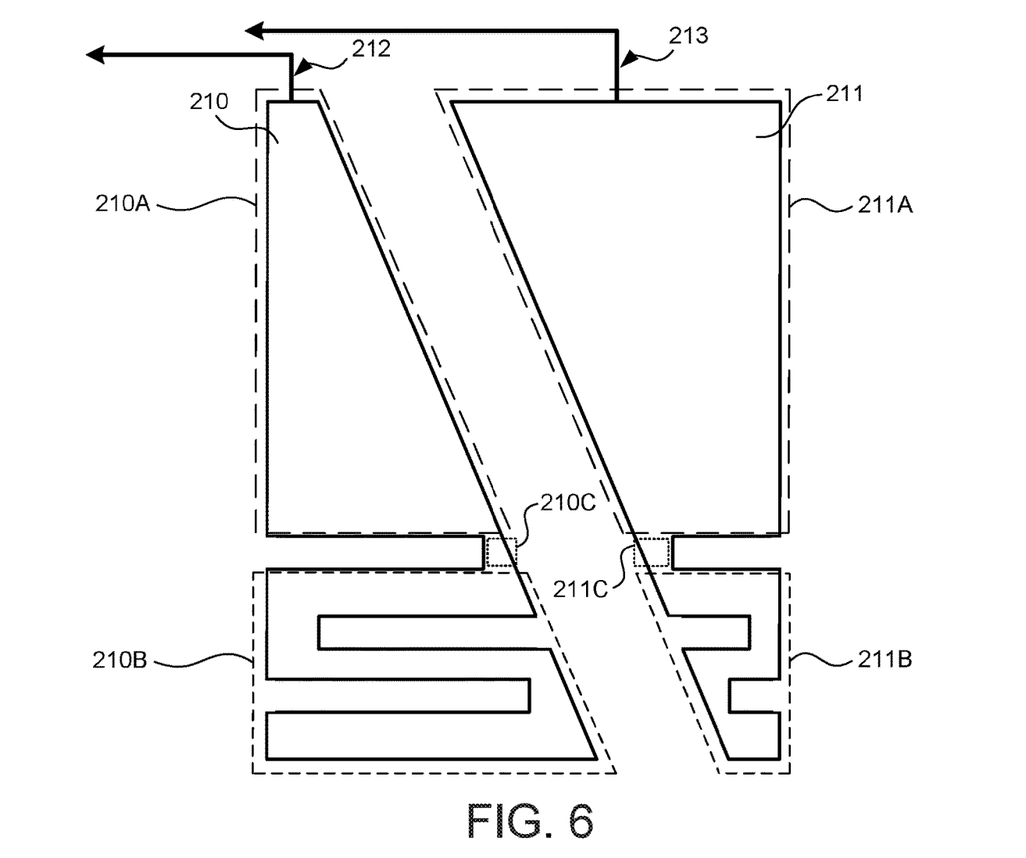
FIG. 6 is a schematic diagram of a connection arrangement of conducting wires and electrodes according to an embodiment of the present invention.
Figure 7:
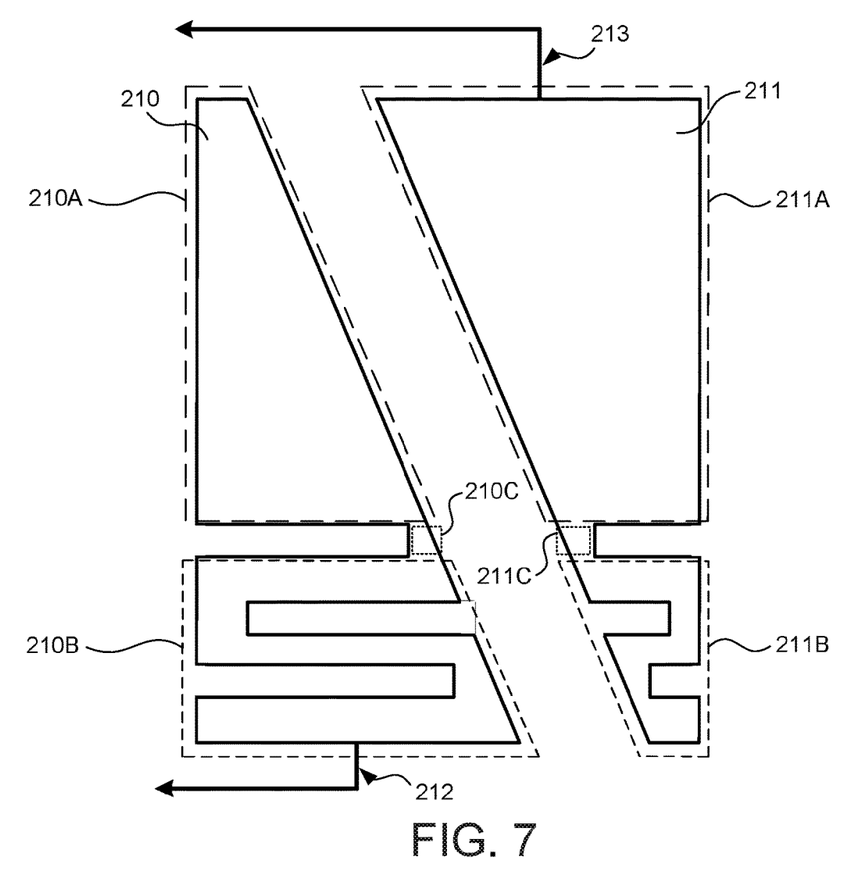
FIG. 7 is a schematic diagram of a connection arrangement of conducting wires and electrodes according to another embodiment of the present invention.

In the foregoing embodiments, besides being connected to the serpentine portion, the conducting wire may also be connected to the main portion. Taking the embodiment in FIG. 2A for example, the conducting wire 212 and the conducting wire 212 may be respectively connected to the main portion 210A and the main portion 211A (as shown in FIG. 6). Alternatively, the conducting wire 212 connects the serpentine portion 210B, and the conducting wire 213 connects the main portion 211A (as shown in FIG. 7). Further, the number of serpentine portions is not limited to one. For example, each of two ends of the main portion may be provided with one serpentine portion, with however the two serpentine portions not connected to each other.

It should be noted that, the shapes, sizes, ratios and sequences of the steps in the drawings are examples for explaining the present invention to one person skilled in the art, not limiting the present invention. In possible implementation, one skilled person in the art would selectively implement part or all technical features of any embodiment of the application or selectively combine part or all technical features of the embodiments of the application based on the disclosure of the present invention to enhance the implementation flexibility of the present invention.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A flat electrode of a single layer self-capacitive touch panel, coupled to a control circuit of the self-capacitive touch panel, the flat electrode comprising:
   a main portion;
   a first serpentine portion, coupled to the main portion and coplanar with the main portion, comprising a serpentine trace; and
   a second serpentine portion, directly connected to the main portion while not directly connected to the first serpentine portion,
   wherein the first serpentine portion increases a resistance of the electrode corresponding to the control circuit through the serpentine trace.

2. The flat electrode of a single layer self-capacitive touch panel according to claim 1, wherein the first serpentine portion comprises a plurality of parallel sub-traces.

3. The flat electrode of a single layer self-capacitive touch panel according to claim 2, wherein widths of the sub-traces are substantially equal, and a total length of the sub-traces is associated with the resistance of the electrode corresponding to the control circuit.

4. The flat electrode of the single layer self-capacitive touch panel according to claim 2, wherein gaps between the sub-traces are substantially equal.

5. The flat electrode of the single layer self-capacitive touch panel according to claim 2, wherein the self-capacitive touch panel further comprises another electrode adjacent to the electrode and coupled to the control circuit, the another electrode comprises a second serpentine portion, and a height of the first serpentine portion is substantially equal to a height of the second serpentine portion.

6. The flat electrode of the single layer self-capacitive touch panel according to claim 5, wherein the second serpentine portion comprises a plurality of another parallel sub-traces, widths of the another sub-traces are substantially equal to the widths of the sub-traces, and gaps between the another sub-traces are substantially equal to the gaps between the sub-traces.

7. The flat electrode of the single layer self-capacitive touch panel according to claim 1, wherein the single layer self-capacitive touch panel comprises a capacitor, the resistance of the electrode and the capacitor form a low-pass filter (LPF), and a cut-off frequency of the low-pass filter (LPF) is determined by adjusting the resistance of the electrode to filter out surges.

8. A flat electrode of the single layer self-capacitive touch panel, coupled to a control circuit of the self-capacitive touch panel, the flat electrode comprising:
a serpentine portion, having a first side;
a main portion, coplanar with the serpentine portion and having a second side;
a connecting portion, connected to the first side and the second side to connect the serpentine portion and the main portion; and
a first serpentine trace, directly connected to the main portion while not directly connected to the serpentine portion,
wherein a length of the connecting portion is smaller than lengths of the first side and the second side.

9. The flat electrode of the single layer self-capacitive touch panel according to claim 8, wherein the first side and the second side are parallel.

10. The flat electrode of the single layer self-capacitive touch panel according to claim 8, wherein the serpentine portion comprises a second serpentine trace.

11. The flat electrode of the single layer self-capacitive touch panel according to claim 10, wherein the second serpentine trace comprises a plurality of sub-traces.

12. The flat electrode of the single layer self-capacitive touch panel according to claim 11, wherein widths of the sub-traces are substantially equal, and a total length of the sub-traces is associated with a resistance of the electrode corresponding to the control circuit.

13. The flat electrode of the single layer self-capacitive touch panel according to claim 11, wherein gaps between the sub-traces are substantially equal.

14. The flat electrode of the single layer self-capacitive touch panel according to claim 13, wherein the self-capacitive touch panel further comprises another electrode adjacent to the electrode and coupled to the control circuit of the self-capacitive touch panel, the another electrode comprises a third serpentine trace, and a height of the third serpentine trace is substantially equal to a height of the second serpentine trace.

15. The flat electrode of the single layer self-capacitive touch panel according to claim 14, wherein the third serpentine trace comprises a plurality of another sub-traces, widths of the another sub-traces are substantially equal to the width of the sub-traces, and gaps between the another sub-traces are substantially equal to gaps between the sub-traces.

16. The flat electrode of the single layer self-capacitive touch panel according to claim 8, wherein the single layer self-capacitive touch panel comprises a capacitor, a resistance of the electrode and the capacitor form an LPF, and a cut-off frequency of the low-pass filter (LPF) is determined by adjusting the resistance of the electrode to filter out surges.

* * * * *